(12) United States Patent
Ketonen

(10) Patent No.: US 6,327,146 B2
(45) Date of Patent: *Dec. 4, 2001

(54) PICK AND PLACE ASSEMBLY AND REFLOW SOLDERING FOR HIGH POWER ACTIVE DEVICES WITH A FLANGE

(75) Inventor: Veli-Pekka Ketonen, Irving, TX (US)

(73) Assignee: Nokia Telecommunications, Oy, Espoo (FI)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/316,732

(22) Filed: May 21, 1999

(51) Int. Cl.⁷ ..................................................... H05K 7/20
(52) U.S. Cl. ........................ 361/704; 361/710; 361/722; 257/719; 165/80.3; 174/16.3
(58) Field of Search ..................................... 361/702–712, 361/690, 713–722, 748, 753, 761, 764, 776, 799–800, 807–809, 810–814, 816, 825; 257/706–727, 784, 785; 165/80.2, 80.3, 80.4, 185; 174/16.3, 35 R, 252, 15.1; 29/840–842; 455/344, 347, 348

(56) References Cited

U.S. PATENT DOCUMENTS

| 4,517,585 | * | 5/1985 | Ridout et al. | 357/81 |
| 4,715,115 | * | 12/1987 | King et al. | 29/841 |
| 5,838,543 | * | 11/1998 | Nakamura et al. | 361/704 |
| 5,866,943 | * | 2/1999 | Mertol | 257/712 |

* cited by examiner

*Primary Examiner*—Leo P. Picard
*Assistant Examiner*—Michael Datskovsky
(74) *Attorney, Agent, or Firm*—Altera Law Group, LLC

(57) ABSTRACT

A heat dissipation mechanism for high power devices allows an automatic pick-and-place and solder assembly of electrical components including the high power devices onto a circuit board in a same pick-and-place and solder process. In the heat dissipation mechanism, a device portion and a flange portion of the high power devices are placed upside down such that the flange portion dissipates heat in the device to mechanics through the circuit board.

8 Claims, 5 Drawing Sheets

PICK AND PLACE ASSEMBLY AND REFLOW SOLDERING FOR HIGH POWER ACTIVE DEVICES WITH A FLANGE

BACKGROUND OF THE INVENTION

1. Field of the Invention

This invention relates in general to an apparatus and method for a power device assembly, and more particularly, to an apparatus and method for integrating power device assembly into a SMD (Surface Mounted) assembly line.

2. Description of Related Art

High power devices in a chip, such as transistors, have high heat dissipation. To cool down the high power devices effectively, a low thermal resistance from the device to the outside is required. To make a low thermal resistance, manufacturers often use a metallic flange at the bottom of a high power device. The metallic flange attaches the power device to a mechanical member, such as a heat sink. The heat in the power device can be easily dissipated to the heat sink through the metallic flange.

In a chip assembly line, to address the heat dissipation problem, a power device with a flange is usually attached to a printed circuit board through a hole in the printed circuit board with two screws. The power device connects to the printed circuit board at its electric leads coming to the device and going out of the device. The metallic flange itself is to be attached to the mechanical member under the printed circuit board. FIGS. 1 and 2 illustrate a traditional attaching method between the metallic flange and the mechanical member. In FIGS. 1 and 2, a printed circuit board 100 has a hole 102 to receive an active high power device 104. The device 104 has two electric leads 106,108. The two leads 106,108 are soldered to conductive strips 110,112, respectively on the printed circuit board. The device 104 includes a device portion 114 and a flange portion 116. The flange portion 116 is attached to the bottom of the device portion 114. Screws 118, 120 are used to mount the flange portion 116 of the device 104 onto a mechanical member 122. In FIG. 2, a cover 124 is used to enclose the assembled printed circuit board 100 between the cover and the mechanical member 122. The heat generated in the device 104 is dissipated to the mechanical member 122 via the flange portion 116 of the device 104. To ensure a low thermal resistance between the device 104 and the mechanical member 122, the screws 118,120 are used to fixedly attach the flange portion 106 to the mechanical member 122.

Accordingly, a traditional method of assembling electrical components including the above active high power device on the printed circuit board requires at least the following phases in the assembly line:

1. SMD (Surface Mounted) components are assembled by a pick and place machine and mounted on the printed circuit board;
2. SMD components are soldered in a reflow oven;
3. The printed circuit board is attached to the mechanical member with a few screws (other than the screws 118,120) to fix the printed circuit board in place;
4. The active power device with the flange portion is placed in the hole of the printed circuit board;
5. The screws (118,120) are assembled and tightened to fix the flange portion of the device to the mechanical member;
6. The electric leads of the device are soldered by hand; and
7. The cover is attached onto the top of the printed circuit board by a few screws (other than the screws 118,120).

The traditional method has at least the following disadvantages:

Additional phases (e.g. the above phases 3–6) are required in comparison to the phases used in a normal SMD (Surface Mounted) reflow process. Thus, the assembly makes the manufacturing process slow and expensive.

Hand soldering is required. The amount of soldering materials, e.g. tin, has an effect on an RF performance of the device. This effect would cause a process variation and a degraded yield.

Accordingly, it can be seen that there is a need for an apparatus and method for integrating the power device assembly into a SMD (Surface Mounted) assembly line. There is also a need for such an apparatus and method still resolving the heat problem in an active high power device.

SUMMARY OF THE INVENTION

To overcome the limitations in the prior art described above, and to overcome other limitations that will become apparent upon reading and understanding the present specification, the present invention is directed to an apparatus and method for a power device assembly, and more particularly, to an apparatus and method for integrating power device assembly into a SMD (Surface Mounted) assembly line.

The present invention provides an automatic pick-and-place and solder assembly with a heat dissipation mechanism. The assembly comprises electrical components including a power device, a circuit board on which the electrical components including the power device are assembled and the power device being assembled with the other electrical components in a same pick-and-place and solder process.

Other embodiments of a system in accordance with the principles of the invention may include alternative or optional additional aspects. One such aspect of the present invention is that the power device has a device portion and a flange portion integral to the device portion. The circuit board includes a hole for receiving the power device. The device portion of the power device is disposed in the hole, the flange portion projects from the hole.

Another aspect of the present invention is that the device portion is disposed below the flange.

Another aspect of the present invention is that a cover is attached onto the top of the flange portion and opposite from the device portion of the power device. The flange portion is thermally connected to the cover, and the flange portion dissipates the heat in the power device to the cover.

Another aspect of the present invention is that the cover is directly connected to the flange portion. Alternatively, an elastic member is disposed between the cover and the flange portion of the power device. The elastic member is made of a thermally conductive material such that the heat is dissipated from the flange portion to the cover via the elastic member.

And yet another aspect of the present invention is that the active power device includes electric leads (signal leads) which are soldered onto the circuit board. The flange portion is soldered (SMD) to metal ground on top of the circuit board. The flange can be connected by electrically conductive material to the cover to improve thermal conductivity and to minimize tolerance problems between the cover and the flange.

The present invention also provides a method of automatically pick-and-place assembling electrical components including a power device on a circuit board. The method comprises picking and placing the electrical components including the power device on the circuit board in a same pick and place process; soldering the electrical components including the power device on the circuit board in a same solder process; and covering the circuit board assembled with the electrical components including the power device, heat in the power device being dissipated to a cover.

The present invention allows the automatic assembly and soldering of high power devices, such as transistors, on a printed circuit board along with the other electrical components. Accordingly, a separate assembly or additional phases for solving heat dissipation of a power device is not required. All electrical components can be assembled in a same pick and place process and in a same solder process.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides an automatic pick-and-place and solder assembly with a heat dissipation mechanism. The heat dissipation mechanism for high power devices allows the assembly of the high power devices to be integrated into an assembly line of SMD (Surface Mounted) electrical components.

The present invention also provides a method of automatically picking-and-placing and soldering assembly for electrical components including high power devices on a circuit board. The electrical components including the high power devices are assembled in a same pick and place process and a same solder process.

Figure 1:
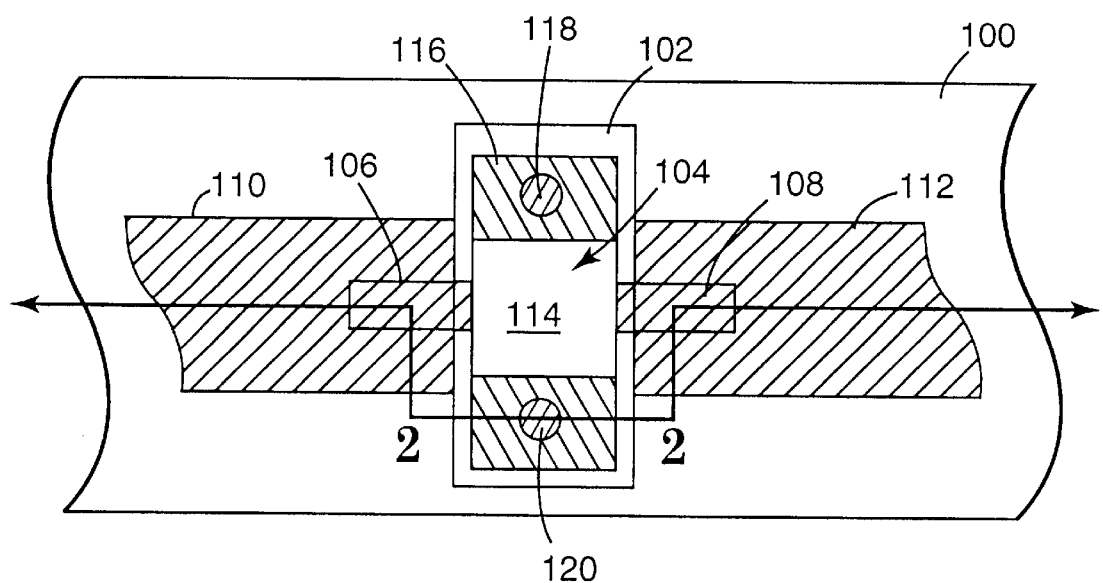
FIG. 1 illustrates a schematic top view of a traditional power device assembly.
Figure 2:
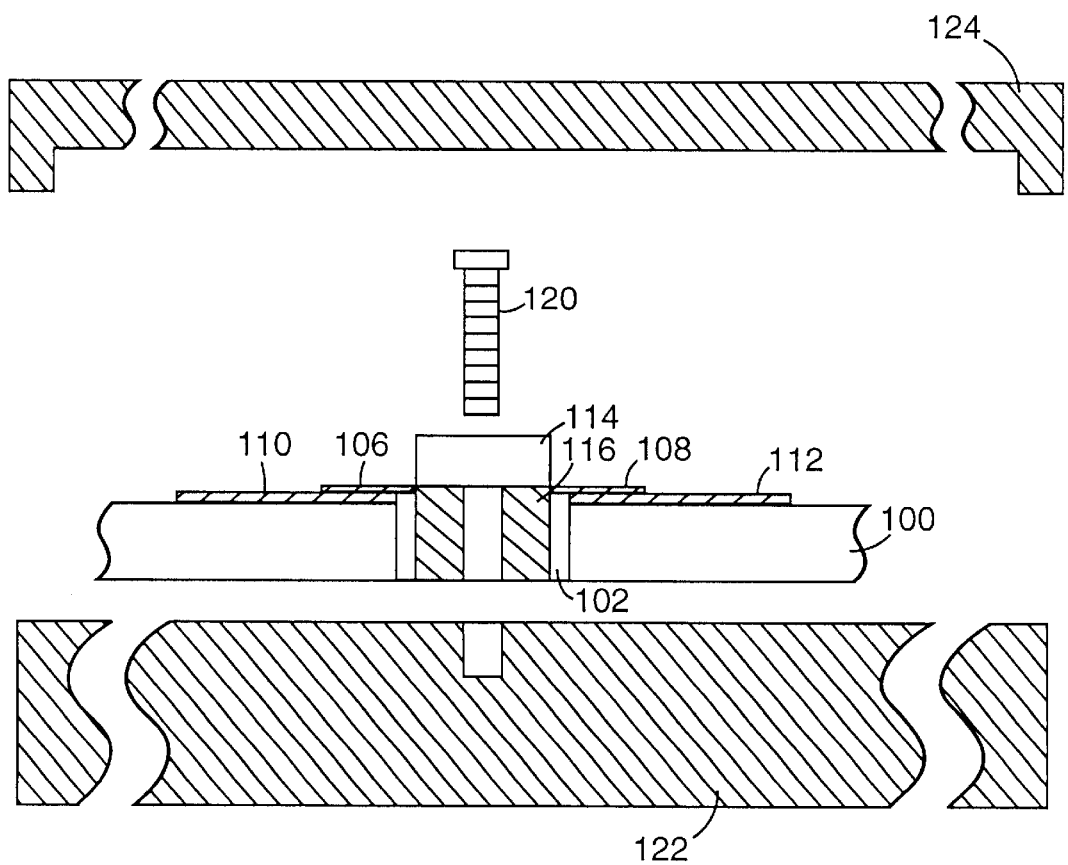
FIG. 2 illustrates a schematic side view of the traditional power device assembly along, line 2—2 of FIG. 1 and with a cover.
Figure 3:
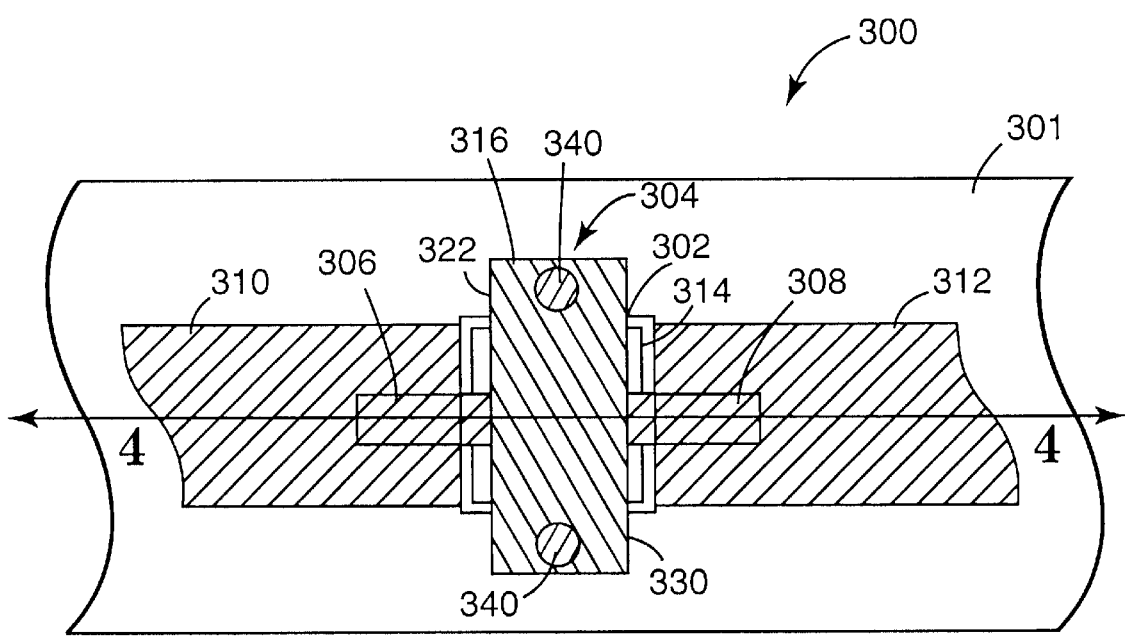
FIG. 3 illustrates a schematic top view of a power device assembly generally in accordance with the principles of the present invention.
Figure 4:
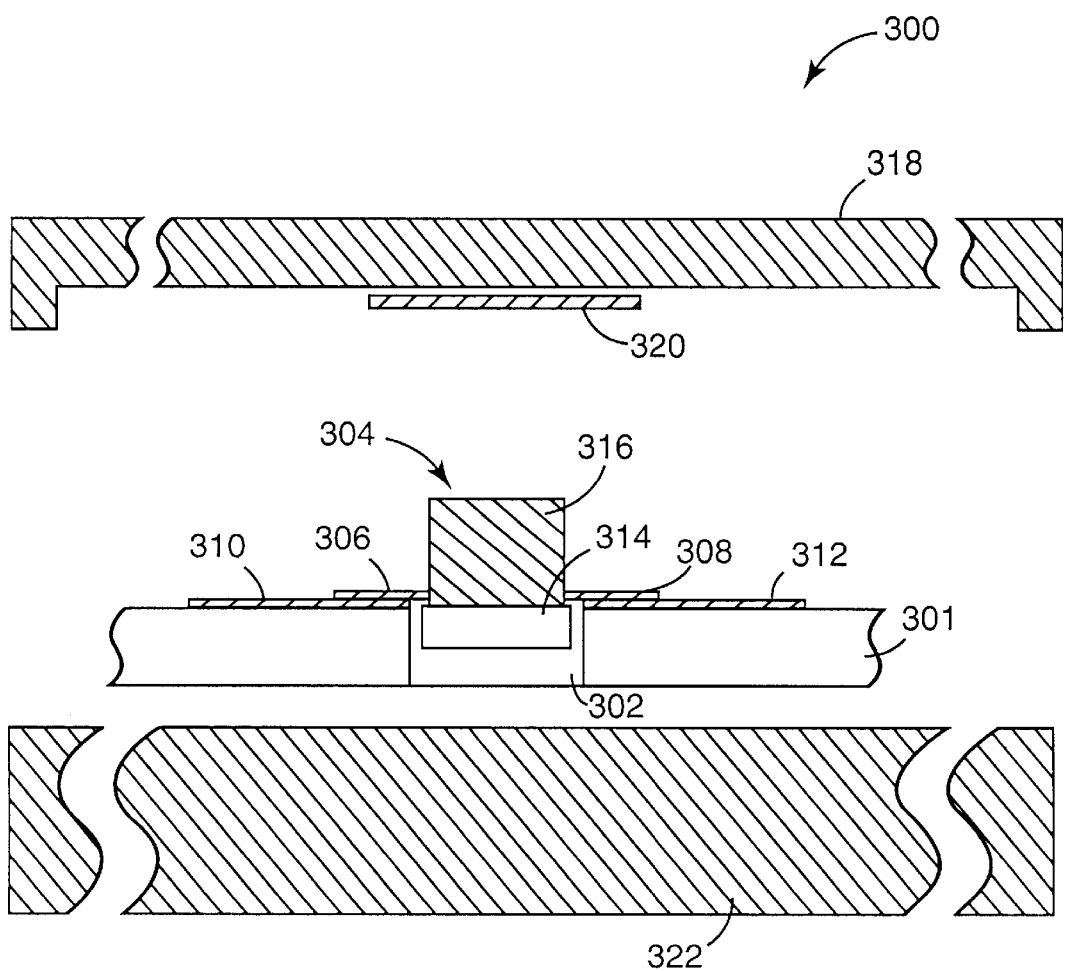
FIG. 4 illustrates a schematic side view of the power device assembly along line 4—4 of FIG. 3 and with a cover.

FIGS. 3–4 illustrate a power device assembly generally in accordance with the principles of the present invention. A circuit board 301, e.g. a printed circuit board, has a hole 302 to receive only the device portion 314 of the active high power device 304. The device 304 has two electric leads 306,308. The two leads 306,308 are soldered to conductive strips 310,312, respectively. The flange portion 316 is attached to the device portion 314. The device portion 314 is disposed in the hole 302. The flange portion 316 projects from the hole 302 and faces upward toward a cover 318. Further, the flange portion 316 stays on top of the circuit board 301. The cover 318 may be directly attached to the flange portion 316 to dissipate heat in the device 304. Alternatively, an elastic member or adhesive 320 with a high thermal conductivity may be directly attached to the flange portion 316 to dissipate the heat in the device 304. The attachment between the cover/elastic member and the flange portion 316 of the device 304 is accomplished during a final phase of connecting the cover 318 to the printed circuit board 301 or to a mechanical member 322. Thus, the extra steps of mounting the flange portion to the mechanical member 322 to reduce thermal resistance and the extra steps of hand soldering the electric leads of the device to the circuit board are eliminated. Further, screws or other fasteners to mount the flange portion 316 to the mechanical member 322 are not required. The heat generated in the device 304 is dissipated to the cover 318 or to the cover 318 via the elastic member 320.

However, those skilled in the art will recognize that hole 340 may be used to facilitate mounting the flange portion 316 to the mechanical member 322 using screws or other fasteners.

In assembly, the high power device 304 is flipped upside down and the two signal leads and the flange from two locations 330, 332 are soldered to the printed circuit board with other SMD (Surface Mounted) electrical components in the same pick-and-place process. Solder past is applied to the flange portion 316 at the peripheral during the reflow process. The soldered flange portion 316 therefore makes a connection to a ground plane (not shown), which provides a path for thermal conduction through the via holes 340 that are in thermal contact with the mechanical member 322. To assist conduction of that away from the device portion 314, the cover 318, which may also act as a heat sink, may be physically coupled to the flange portion 316 and/or the heat conductive member or adhesive 320.

The high power device 304 with the flange portion 316 can be packed upside down in tape and reel in manufacture. Accordingly, a pick-and-place machine can handle the high power devices as normal SMD devices. The cover 318 is made of thermally well conductive elastic material. An example of the cover material is SILPAD 400 made by The Bergquist Company. It is appreciated that other suitable thermally well conductive materials can be used within the scope of the present invention.

A method of assembling electrical components including the devices 304 on the circuit board 300 includes the following phases:

1. All components including the devices 304 are assembled by the pick-and-place machine;
2. All components including the devices 304 are soldered in an oven (e.g. a reflow oven); and
3. The cover 318 is attached onto the top of the circuit board 301 or the mechanical member 322 by a few screws.

Accordingly, in phase 3, the cover 318 is automatically attached to the flange portion 316 of the device 304. Thus, the thermal resistance is low between the cover 318 and the flange portion 316. Heat in the device 304 is dissipated to the cover 318.

The above method of the present invention has at least the following advantages:

A single SMD process is used. The present invention provides a fast and cheap way of assembling electrical components including the active high power devices.

The present invention uses a single reflow soldering process for all electrical components including the active high power devices. Thus, no hand soldering and related process variation are required for soldering the power devices.

One application of the method according to the present invention is to assemble active power devices with tenths of watts of output power. It is appreciated that the present invention can be used in many other applications.

The present invention also provides volume product designers more possibilities to choose different active devices.

Figure 5:
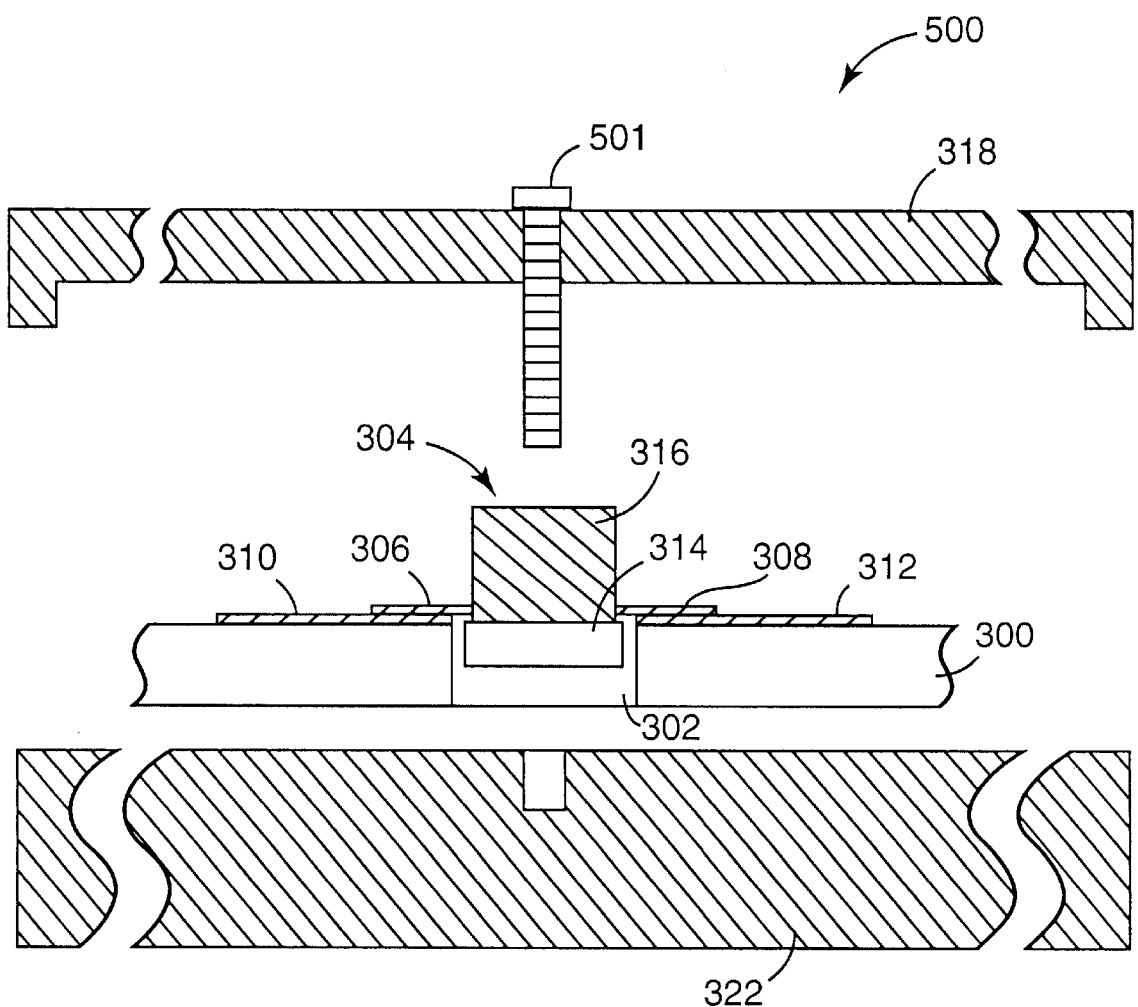
FIG. 5 illustrates a schematic side view of a second embodiment of a power device assembly generally in accordance with the principles of the present invention.

FIG. 5 illustrates a second embodiment of a power device assembly 500 generally in accordance with the principles of the present invention. In addition to the features shown in FIG. 4, a screw 501 is used to further tighten the connection between the cover 318 and the flange portion 316. The screw 501 can be pre-assembled with the cover 318. The tightened connection further improves a thermal contact between the flange portion 316 and the cover 318. As also shown in FIG. 3, the flange portion 316 includes a hole 340 to receive the screw 501, although the hole 340 of FIG. 3 is not visible in FIG. 5.

It is appreciated that the mechanical member 322 in FIGS. 3–5 is preferably a heat sink, and the cover 318 is preferably a heat sink as well. It is also appreciated that other types of fasteners can be used to tighten the cover and the flange member within the scope of the invention.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. An automatic pick-and-place and solder assembly, comprising:

electrical components including a power device, the power device having a device portion and a flange portion integral to the device portion;

a circuit board on which the electrical components including the power device are assembled, the circuit board including a hole, wherein only the device portion is disposed within the hole and wherein the flange portion projects above the top of the circuit board; and the power device being assembled with the other electrical components in a same pick-and-place and solder process, the flange portion soldered to a ground plane of the circuit board, which provides thermal conduction through a plurality of via holes along the ground plane.

2. The assembly of claim 1, wherein the flange portion is coupled to a heat dissipating device.

3. The assembly of claim 2, wherein the heat dissipating device comprises a cover.

4. The assembly of claim 3, wherein the cover is a heat sink.

5. The assembly of claim 2, wherein the heat dissipating device further comprises a thermally conductive material and a cover, wherein the thermally conductive material is disposed between the cover and the flange portion.

6. The assembly of claim 5, wherein the cover is a heat sink.

7. The assembly of claim 2, wherein the heat dissipation device comprises a heat sink.

8. The assembly of claim 1, wherein the power device includes electric leads which are soldered onto the circuit board.

* * * * *